United States Patent
Kwak et al.

(10) Patent No.: US 7,491,979 B2
(45) Date of Patent: Feb. 17, 2009

(54) REFLECTIVE ELECTRODE AND COMPOUND SEMICONDUCTOR LIGHT EMITTING DEVICE INCLUDING THE SAME

(75) Inventors: Joon-seop Kwak, Gyeonggi-do (KR); Tae-yeon Seong, Gwangju-si (KR); June-o Song, Gwangju-si (KR)

(73) Assignees: Samsung Electro-Mechanics Co., Ltd., Suwon-Si, Gyeonggi-Do (KR); Gwangju Institute of Science and Technology, Buk-Gu, Gwangju-Si (KR)

( * ) Notice: Subject to any disclaimer, the term of this patent is extended or adjusted under 35 U.S.C. 154(b) by 0 days.

(21) Appl. No.: 12/000,870

(22) Filed: Dec. 18, 2007

(65) Prior Publication Data
US 2008/0105890 A1 May 8, 2008

Related U.S. Application Data

(62) Division of application No. 11/080,509, filed on Mar. 16, 2005, now abandoned.

(30) Foreign Application Priority Data
Aug. 31, 2004 (KR) .................. 10-2004-0069151

(51) Int. Cl.
H01L 33/00 (2006.01)
(52) U.S. Cl. .......................... 257/98; 257/79
(58) Field of Classification Search ............ 257/79, 257/98
See application file for complete search history.

(56) References Cited

U.S. PATENT DOCUMENTS

| 5,481,122 | A | 1/1996 | Jou et al. |
| 2003/0059972 | A1 | 3/2003 | Ikeda et al. |
| 2003/0118865 | A1 | 6/2003 | Marks et al. |
| 2004/0104395 | A1 | 6/2004 | Hagimoto et al. |

FOREIGN PATENT DOCUMENTS

| JP | 2002-329889 A | 11/2002 |
| JP | 2004-179347 A | 6/2004 |
| WO | WO 01/47038 A1 | 6/2001 |

OTHER PUBLICATIONS

Text of the First Office Action issued in corresponding Chinese Patent Application No. 200510054281X, and translation thereof.
Office Action mailed Apr. 21, 2008 from the Korean Intellectual Property Office.

*Primary Examiner*—Long Pham
(74) *Attorney, Agent, or Firm*—Buchanan Ingersoll & Rooney PC

(57) ABSTRACT

Provided are a reflective electrode and a compound semiconductor light emitting device, such as an LED or an LD, including the same. The reflective electrode, which is formed on a p-type compound semiconductor layer, includes: a first electrode layer forming an ohmic contact with the p-type compound semiconductor layer; a second electrode layer disposed on the first electrode layer and formed of transparent conductive oxide; and a third electrode layer disposed on the second electrode layer and formed of an optical reflective material.

26 Claims, 3 Drawing Sheets

REFLECTIVE   EMITTING   REFLECTIVE
LIGHT        LIGHT      LIGHT

US 7,491,979 B2

REFLECTIVE ELECTRODE AND COMPOUND SEMICONDUCTOR LIGHT EMITTING DEVICE INCLUDING THE SAME

Priority is claimed to Korean Patent Application No. 10-2004-0069151, filed on Aug. 31, 2004 in the Korean Intellectual Property Office, the disclosure of which is incorporated herein in its entirety by reference.

BACKGROUND OF THE INVENTION

1. Field of the Invention

The present invention relates to a reflective electrode and a compound semiconductor light emitting device, and more particularly, to a reflective electrode with low contact resistance, high reflectance, and improved electrical conductivity, and a compound semiconductor light emitting device including the same.

2. Description of the Related Art

Compound semiconductor light emitting devices, for example, semiconductor laser diodes such as light emitting diodes (LEDs) and laser diodes (LDs), convert electric signals into optical signals using the characteristics of compound semiconductors. Laser beams of the compound semiconductor light emitting devices have practically been applied in the fields of optical communications, multiple communications, and space communications. Semiconductor lasers are widely used as light sources for data transmission or data recording and reading in the field of optical communications and such apparatuses as compact disk players (CDPs) or digital versatile disk players (DVDPs).

A compound semiconductor light emitting device can be categorized into a top-emitting light emitting diode (TLED) and a flip-chip light emitting diode (FCLED) according to the emission direction of light.

The TLED emits light through a p-type electrode, which forms an ohmic contact with a p-type compound semiconductor layer. The p-type electrode includes a Ni layer and an Au layer, which are sequentially stacked on a p-type compound semiconductor layer. However, since the p-type electrode formed of the Ni layer and the Au layer is translucent, the TLED including the p-type electrode has low optical efficiency and low brightness.

In the case of the FCLED, light emitted from an active layer is reflected by a reflective electrode formed on a p-type compound semiconductor layer, and the reflected light is emitted through a substrate. The reflective electrode is formed of a material having good optical reflectance, such as Ag, Al, and Rh. The FCLED including this reflective electrode can have high optical efficiency and high brightness. However, owing to a relatively high contact resistance between the reflective electrode and the p-type compound semiconductor layer, a light emitting device including the reflective electrode has a shortened life span and unreliable characteristics.

To solve these problems, research on materials and structures for an electrode having low contact resistance and high reflectance has progressed.

International Patent Publication No. WO 01/47038 A1 discloses a semiconductor light emitting device including a reflective electrode, which is provided with an ohmic contact layer disposed between the reflective electrode and a p-type compound semiconductor layer. However, the ohmic contact layer is formed of a material having low optical transmissivity, such as Ti or Ni/Au, thus degrading optical efficiency and brightness.

SUMMARY OF THE INVENTION

Embodiments of the present invention provides a reflective electrode, which reduces contact resistance and has high reflectance and improved electrical conductivity, and a compound semiconductor light emitting device including the same.

The present invention can be embodied as a reflective electrode of a compound semiconductor light emitting device, which is formed on a p-type compound semiconductor layer. The electrode includes, for example, a first, second and third electrode layer. The first electrode layer forms an ohmic contact with the p-type compound semiconductor layer. The second electrode layer is disposed on the first electrode layer and is formed of transparent conductive oxide. The third electrode layer disposed on the second electrode layer and formed of an optical reflective material, in this embodiment.

The first electrode layer may be formed of indium oxide to which at least an additive element selected from the group consisting of Mg, Cu, Zr, and Sb is added, and an addition ratio of the additive element to the indium oxide is in the range of 0.001 to 49 atomic percent, for example. The thickness of the first electrode layer can range from 0.1 to 500 nm.

Alternatively, the first electrode layer can be formed of Ag and an Ag-based alloy, and the Ag-based alloy can be an alloy of Ag and at least one selected from the group consisting of Mg, Zn, Sc, Hf, Zr, Te, Se, Ta, W, Nb, Cu, Si, Ni, Co, Mo, Cr, Mn, Hg, Pr, and La. The thickness of the first electrode layer can range from 0.1 to 500 nm, for example.

The transparent conductive oxide can be formed of a material selected from the group consisting of ITO, ZITO, ZIO, GIO, ZTO, FTO, AZO, GZO, $In_4Sn_3O_{12}$, and $Zn_{1-x}Mg_xO$ ($0 \leq x \leq 1$), and the thickness of the second electrode layer can range from 0.1 to 500 nm.

The optical reflective material is one selected from the group consisting of Ag, an Ag-based alloy, Al, an Al-based alloy, and Rh, and the thickness of the third electrode layer can range from 10 to 5000 nm, for example.

An optional fourth electrode layer can be formed on the third electrode layer using a predetermined material to prevent agglomeration caused by an annealing process from occurring on the surface of the third electrode layer. Examples of the fourth electrode layer material include one selected from the group consisting of Cu, Cu/Ru, Cu/Ir, a Cu-based alloy, Cu-based alloy/Ru, and Cu-based alloy/Ir. The fourth electrode layer ranges from 1 to 500 nm, for example.

The present invention can also be embodied in a compound semiconductor light emitting device, for example. The compound semiconductor light emitting device includes an n-type electrode, a p-type electrode, and an n-type compound semiconductor layer, an active layer, and a p-type compound semiconductor layer, which are interposed between the n-type electrode and the p-type electrode, The p-type electrode is structured in accordance with the above.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
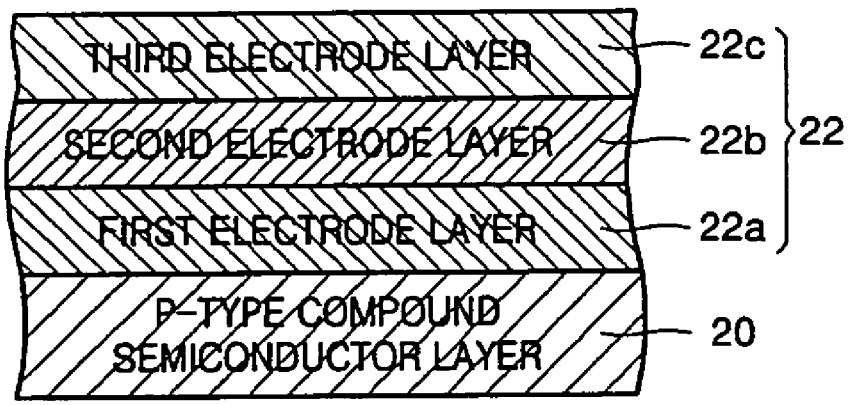
FIG. 1 is a cross-sectional view of a reflective electrode according to an embodiment of the present invention.

FIG. 1 is a cross-sectional view of a reflective electrode 22 according to an embodiment of the present invention.

Referring to FIG. 1, the reflective electrode 22 is formed on a p-type compound semiconductor layer 20. The reflective electrode 22 includes a first electrode layer 22a, a second electrode layer 22b, and a third electrode layer 22c, which are sequentially stacked on the p-type compound semiconductor layer 20.

The first electrode layer 22a is formed of a material, which can form an ohmic contact with the p-type compound semiconductor layer 20, to a thickness of about 0.1 to 500 nm.

In the present embodiment, the first electrode layer 22a is formed of indium oxide (e.g., $In_2O_3$) to which at least an additive element selected from the group consisting of Mg, Cu, Zr, and Sb is added.

The additive element controls the band gap, electron affinity, and work function of the indium oxide, thereby improving the ohmic contact characteristic of the first electrode layer 22a. Specifically, the additive element increases the effective carrier concentration of the p-type compound semiconductor layer 20 and readily reacts with elements constituting the p-type compound semiconductor layer 20 except nitrogen.

For example, when the p-type compound semiconductor layer 20 is formed of a GaN-based compound, the additive element may react to Ga prior to N. In this case, Ga of the p-type compound semiconductor layer 20 reacts to the additive element, thus generating Ga vacancies in the surface of the p-type compound semiconductor layer 20. As the Ga vacancies function as a p-type dopant, an effective concentration of p-type carriers in the surface of p-type compound semiconductor layer 20 increases.

The indium oxide to which the additive element is added reacts to a $Ga_2O_3$ layer, which is a native oxide layer that remains on the p-type compound semiconductor layer 20, thus generating a transparent conductive oxide (TCO) between the p-type compound semiconductor layer 20 and the first electrode layer 22a. The $Ga_2O_3$ layer serves as a barrier to the flow of carriers at an interface between the p-type compound semiconductor layer 20 and the first electrode layer 22a. Thus, a tunneling conduction phenomenon may occur at the interface between the first electrode layer 22a and the p-type compound semiconductor layer 20, thus improving the ohmic contact characteristic of the first electrode layer 22a.

An addition ratio of the additive element to indium oxide is in the range of 0.001 to 49 atomic percent.

In another embodiment, the first electrode layer 22a may be formed of Ag or an Ag-based alloy. The Ag-based alloy is an alloy of Ag and at least one selected from the group consisting of Mg, Zn, Sc, Hf, Zr, Te, Se, Ta, W, Nb, Cu, Si, Ni, Co, Mo, Cr, Mn, Hg, Pr, and La. The Ag or Ag-based alloy may form an ohmic contact with the p-type compound semiconductor layer 20, as described above. That is, the Ag and alloy elements, which may form the first electrode layer 22a, increase the effective carrier concentration of the p-type compound semiconductor layer 20 and readily react with elements constituting the p-type compound semiconductor layer 20 except nitrogen. A detailed description thereof will be omitted here.

The second electrode layer 22b is formed of TCO to a thickness of 0.1 to 500 nm. The TCO may be one selected from the group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{1-x}Mg_xO$, $0 \leq x \leq 1$). The TCO may be, for example, $Zn_2In_2O_5$, $GaInO_3$, $ZnSnO_3$, F-doped $SnO_2$, Al-doped ZnO, Ga-doped ZnO, MgO, or ZnO.

The third electrode layer 22c is formed of an optical reflective material to a thickness of about 10 to 5000 nm. The optical reflective material is one selected from the group consisting of Ag, an Ag-based alloy, Al, an Al-based alloy, and Rh. Here, the Ag-based alloy refers to an alloy of Ag and any alloy material, and the Al-based alloy refers to an alloy of Al and any alloy material.

The first, second, and third electrode layers 22a, 22b, and 22c can be formed using an electronic beam (e-beam) & thermal evaporator or a dual-type thermal evaporator. Also, the first, second, and third electrode layers 22a, 22b, and 22c can be formed by physical vapor deposition (PVD), chemical vapor deposition (CVD), or plasma laser deposition (PLD). Each of the first, second, and third electrode layers 22a, 22b, and 22c can be deposited at a temperature of about 20 to 1500° C. inside a reactor that is maintained under an atmospheric pressure to $10^{-12}$ Torr.

After the third electrode layer 22c is formed, the resultant structure is annealed. Specifically, the resultant structure where the third electrode layer 22c is formed is annealed in an atmosphere containing at least one of N, Ar, He, $O_2$, $H_2$, and air. The annealing process is performed at a temperature of about 200 to 700° C. for 10 seconds to 2 hours.

Another annealing process may be additionally performed under the same conditions after the second electrode layer 22b is formed. That is, after each of the second and third electrode layers 22b and 22c is formed, an annealing process may be performed. Thus, the formation of the reflective electrode may comprise performing an annealing process twice.

Figure 2:
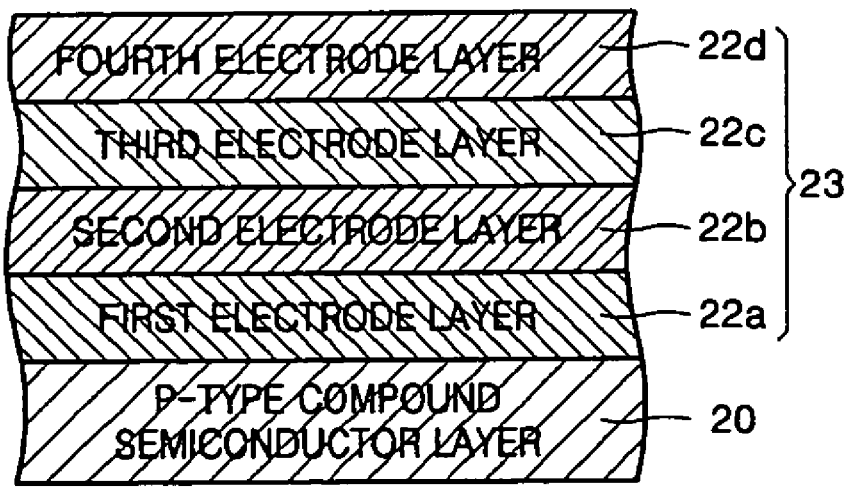
FIG. 2 is a cross-sectional view of a reflective electrode according to another embodiment of the present invention.

FIG. 2 is a cross-sectional view of a reflective electrode 23 according to another embodiment of the present invention.

In the present embodiment, only different characteristics than in the first embodiment will be described, and the same reference numerals are used to denote the same elements as in the first embodiment.

Referring to FIG. 2, the reflective electrode 23 further includes a fourth electrode layer 22d disposed on a third electrode layer 22c in comparison with the reflective electrode 22 shown in FIG. 1.

The fourth electrode layer 22d is formed of one selected from the group consisting of Cu, Cu/Ru, Cu/Ir, a Cu-based alloy, a Cu-based alloy/Ru, and a Cu-based alloy/Ir. The fourth electrode layer 22d is formed to a thickness of about 1 to 500 nm. Here, the Cu-based alloy refers to an alloy Cu and any alloy material.

The fourth electrode layer 22d prevents an agglomeration caused by an annealing process from occurring on the surface of the third electrode layer 22c.

Specifically, there is a great difference in surface energy between a p-type compound semiconductor layer 20 and a metal constituting the third electrode layer 22c, for example, Ag, an Ag-based alloy, Al, an Al-based alloy, or Rh. It is generally known that the difference in surface energy allows agglomeration to occur, and this can occur on the surface of the third electrode layer 22c during the annealing process. When the agglomeration occurs on the surface of the third electrode layer 22c, the reflectance of the third electrode layer 22c is degraded, thus reducing an optical output of a compound semiconductor light emitting device including the reflective electrode 22.

In the present embodiment, the material forming the fourth electrode layer 22d has a relatively similar surface energy to that of the p-type nitride semiconductor layer 20 and an excellent electrical conductivity. Thus, the fourth electrode layer 22d formed on the third electrode layer 22c serves as both an agglomeration preventing layer (APL) and an electrode layer.

The fourth electrode layer 22d can be formed by PVD, CVD, or PLD using an e-beam & thermal evaporator or a dual-type thermal evaporator. The fourth electrode layer 22d is deposited at a temperature of about 20 to 1500° C. inside a reactor that is maintained under an atmospheric pressure to $10^{-12}$ Torr.

After the fourth electrode layer 22d is formed, the resultant structure may be annealed. Specifically, the resultant structure where the fourth electrode layer 22d is formed is annealed in an atmosphere containing at least one of N, Ar, He, $O_2$, $H_2$, and air. The annealing process is performed at a temperature of 200 to 700° C. for 10 seconds to 2 hours.

Figure 3:
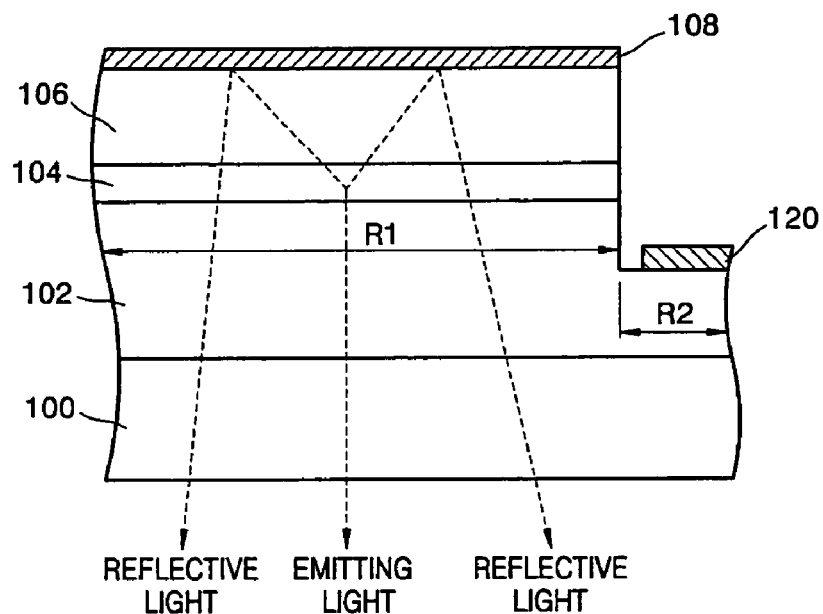
FIG. 3 is a cross-sectional view of a compound semiconductor light emitting device including the reflective electrode shown in FIG. 1.

FIG. 3 is a cross-sectional view of a compound semiconductor light emitting device including the reflective electrode shown in FIG. 1.

Referring to FIG. 3, the compound semiconductor light emitting device includes at least an n-type compound semiconductor layer 102, an active layer 104, and a p-type compound semiconductor layer 106 between an n-type electrode 120 and a p-type electrode 108. The p-type electrode 108 is the same as the reflective electrode 22 shown in FIG. 1. That is, the p-type electrode 108 includes the first electrode layer 22a, the second electrode layer 22b, and the third electrode layer 22c shown in FIG. 1 of which operations and effects are the same as described above.

The n-type compound semiconductor layer 102 includes a first compound semiconductor layer as a lower contact layer, which is stacked on a substrate 100 and has a step difference, and a lower clad layer stacked on the first compound semiconductor layer. The n-type lower electrode 120 is disposed in a stepped portion of the first compound semiconductor layer.

The substrate 200 is typically a sapphire substrate or a freestanding GaN substrate. The first compound semiconductor layer may be an n-GaN-based III-V group nitride compound semiconductor layer, preferably, an n-GaN layer. However, the present invention is not limited thereto, but the first compound semiconductor layer may be formed of any other III-V group compound semiconductor that enables laser oscillation (lasing). The lower clad layer may be an n-GaN/AlGaN layer having a predetermined refractive index, but it is possible to use any other compound semiconductor layer that enables lasing.

The active layer 104 may be formed of any material that enables lasing, preferably, a material that can oscillate laser beams having a small critical current and a stable transverse mode characteristic. The active layer 104 may be a GaN-based III-V group nitride compound semiconductor layer, which is InxAlyGa1-x-yN ($0 \leq x \leq 1$, $0 \leq y \leq 1$, and $x+y \leq 1$). The active layer 104 may have one of a multiple quantum well (MQW) structure and a single quantum well (SQW) structure, and the technical scope of the present invention is not limited by the structure of the active layer 104.

An upper waveguide layer and a lower waveguide layer may be further formed on and under the active layer 104, respectively. The upper and lower waveguide layers are formed of a material having a low refractive index, preferably, a GaN-based III-V group compound semiconductor. The lower waveguide layer may be an n-GaN layer, while the upper waveguide layer may be a p-GaN layer.

The p-type compound semiconductor layer 106 is stacked on the active layer 104 and includes an upper clad layer, which has a lower refractive index than the active layer 104, and a second compound semiconductor layer, which is an ohmic contact layer stacked on the upper clad layer. The second compound semiconductor layer may be a p-GaN-based III-V group nitride compound semiconductor layer, preferably, a p-GaN layer. However, the present invention is not limited thereto, but the second compound semiconductor layer may be any other III-V group compound semiconductor layer that enables laser oscillation(lasing). The upper clad layer may be a p-GaN/AlGaN layer having a predetermined refractive index, but it is possible to use any other compound semiconductor layer that enables lasing.

An n-type electrode 120 is disposed in a stepped portion of the first compound semiconductor layer, which is a lower ohmic contact layer. Alternatively, the n-type electrode 120 may be formed on a bottom surface of the substrate 100 opposite the p-type electrode 108. In this case, the substrate 100 may be formed of silicon carbide (SiC) or gallium nitride (GaN).

Figure 4A:
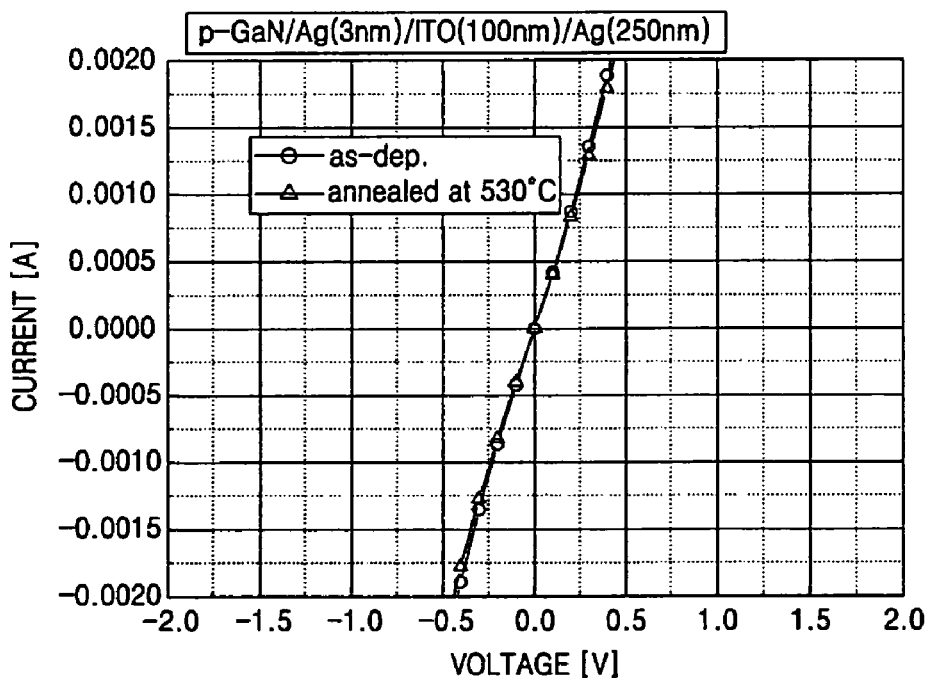
FIG. 4A is a graph showing a current-voltage (I-V) characteristic of the reflective electrode (Ag/ITO/Ag) shown in FIG. 1.

FIG. 4A is a graph showing a current-voltage (I-V) characteristic of the reflective electrode (Ag/ITO/Ag) shown in FIG. 1.

The reflective electrode includes a first electrode layer formed of Ag, a second electrode layer formed of ITO, and a third electrode layer formed of Ag, which were sequentially stacked on a substrate. The first, second, and third electrode layers were formed to a thickness of about 3, 100, and 250 nm, respectively.

The electrical characteristics of the reflective electrode (Ag/ITO/Ag) were measured as deposited and as annealed at 530° C., respectively. The annealing process was performed in an $O_2$ or N atmosphere for 1 minute after the second electrode layer was formed. After the third electrode layer was formed, an annealing process was additionally performed under the same conditions.

Figure 4B:
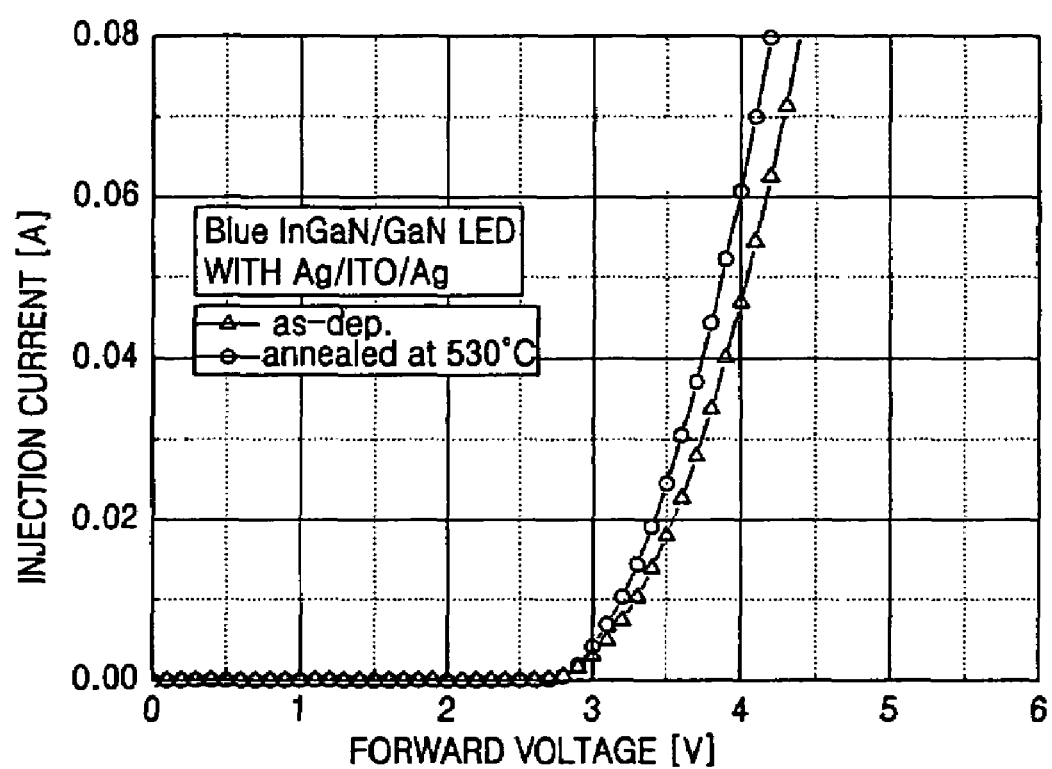
FIG. 4B is a graph showing an I-V characteristic of an InGaN blue light emitting diode (LED) including the reflective electrode (Ag/ITO/Ag) shown in FIG. 1.

FIG. 4B is a graph showing an I-V characteristic of an InGaN blue light emitting diode (LED) including the reflective electrode (Ag/ITO/Ag) shown in FIG. 1.

As can be seen from FIGS. 4A and 4B, the annealed reflective electrode and the light emitting device including the same exhibited an excellent I-V characteristic.

Hereinafter, experimental examples, which were conducted by the inventors in connection with the reflective electrode according to the present invention, will be described. The scope of the present invention is not limited by the following exemplary processes.

At the outset, the surface of a structure, in which a p-type GaN-based compound semiconductor layer is formed on a substrate, was washed in an ultrasonic bath at a temperature of 60° C. using trichloroethylene (TCE), acetone, methanol, and distilled water, respectively, for 5 minutes each time. Then, the resultant structure was hard baked at a temperature of 100° C. for 10 minutes to remove the remaining moisture from this sample.

Thereafter, a photoresist layer was spin-coated on the p-type compound semiconductor layer at 4,500 RPM. The resultant structure was soft baked at a temperature of 85° C. for 15 minutes. To develop a mask pattern, the sample was aligned with a mask, exposed to ultraviolet rays (UV) of 22.8 mW for 15 seconds, and dipped in a solution containing a mixture of a developing solution with distilled water in a ratio of 1:4 for 25 seconds.

Thereafter, the developed sample was dipped in a buffered oxide etchant (BOE) solution for 5 minutes to remove a contaminated layer from the sample. Then, a first electrode layer was formed on the resultant structure using an e-beam evaporator. The first electrode layer was deposited by mounting Ag as an object of reaction on a mounting stage.

After the first electrode layer was deposited, a second electrode layer was deposited using ITO, a lift-off process was carried out using acetone, and the sample was loaded into a rapid thermal annealing (RTA) furnace and annealed at a temperature of about 430 to 530° C. for 1 minute. After that, a third electrode layer was deposited on the second electrode layer using Ag inside an e-beam evaporator. The resultant structure where the third electrode layer is deposited was annealed in an $O_2$ or N atmosphere under the same conditions as when the second electrode layer was annealed. As a result, the reflective electrode was completed.

The foregoing method of forming the reflective electrode can be applied to manufacture the light emitting devices shown in FIG. 3.

The reflective electrode of the present invention obtains low contact resistance, high reflectance, improved electrical conductivity, and an excellent I-V characteristic.

Also, the compound semiconductor light emitting device including the foregoing reflective electrode requires a low operating voltage and exhibits improved optical output and I-V characteristic. This compound semiconductor light emitting device reduces power dissipation, thus greatly improving luminous efficiency.

Further, the reflective electrode of the present invention can be applied to light emitting devices, such as LEDs and LDs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A reflective electrode of a compound semiconductor light emitting device, which is formed on a p-type compound semiconductor layer, the electrode comprising:
   a first electrode layer forming an ohmic contact with the p-type compound semiconductor layer;
   a second electrode layer disposed on the first electrode layer and formed of transparent conductive oxide;
   a third electrode layer disposed on the second electrode layer and formed of an optical reflective material; and
   a fourth electrode layer formed on the third electrode layer using a predetermined material to prevent agglomeration caused by an annealing process from occurring on the surface of the third electrode layer.

2. The electrode of claim 1, wherein the first electrode layer is formed of indium oxide to which at least an additive element selected from the group consisting of Mg, Cu, Zr, and Sb is added.

3. The electrode of claim 2, wherein an addition ratio of the additive element to the indium oxide is in the range of 0.001 to 49 atomic percent.

4. The electrode of claim 2, wherein the thickness of the first electrode layer ranges from 0.1 to 500 nm.

5. The electrode of claim 1, wherein the first electrode layer is formed of Ag and an Ag-based alloy.

6. The electrode of claim 5, wherein the Ag-based alloy is an alloy of Ag and at least one selected from the group consisting of Mg, Zn, Sc, Hf, Zr, Te, Se, Ta, W, Nb, Cu, Si, Ni, Co, Mo, Cr, Mn, Hg, Pr, and La.

7. The electrode of claim 5, wherein the thickness of the first electrode layer ranges from 0.1 to 500 nm.

8. The electrode of claim 1, wherein the transparent conductive oxide is formed of one selected from the group consisting of ITO, ZITO, ZIO, GIO, ZTO, FTO, AZO, GZO, $In_4Sn_3O_{12}$, and $Zn_{1-x}Mg_xO$ ($0 \leq x \leq 1$).

9. The electrode of claim 8, wherein the thickness of the second electrode layer ranges from 0.1 to 500 nm.

10. The electrode of claim 1, wherein the optical reflective material is one selected from the group consisting of Ag, an Ag-based alloy, Al, an Al-based alloy, and Rh.

11. The electrode of claim 10, wherein the thickness of the third electrode layer ranges from 10 to 5000 nm.

12. The electrode of claim 1, wherein the fourth electrode layer is formed of one selected from the group consisting of Cu, Cu/Ru, Cu/Ir, a Cu-based alloy, Cu-based alloy/Ru, and Cu-based alloy/Ir.

13. The electrode of claim 12, wherein the thickness of the fourth electrode layer ranges from 1 to 500 nm.

14. A compound semiconductor light emitting device comprising an n-type electrode, a p-type electrode, and an n-type compound semiconductor layer, an active layer, and a p-type compound semiconductor layer, which are interposed between the n-type electrode and the p-type electrode,
   wherein the p-type electrode comprises:
      a first electrode layer forming an ohmic contact with the p-type compound semiconductor layer;
      a second electrode layer disposed on the first electrode layer and formed of transparent conductive oxide;
      a third electrode layer disposed on the second electrode layer and formed of an optical reflective material; and
      a fourth electrode layer formed on the third electrode layer using a predetermined material to prevent agglomeration caused by an annealing process from occurring on the surface of the third electrode layer.

15. The device of claim 14, wherein the first electrode layer is formed of indium oxide to which at least an additive element selected from the group consisting of Mg, Cu, Zr, and Sb is added.

16. The device of claim 15, wherein an addition ratio of the additive element to the indium oxide is in the range of 0.001 to 49 atomic percent.

17. The device of claim 15, wherein the thickness of the first electrode layer ranges from 0.1 to 500 nm.

18. The device of claim 14, wherein the first electrode layer is formed of one of Ag and an Ag-based alloy.

19. The device of claim 18, wherein the Ag-based alloy is an alloy of Ag and at least one selected from the group consisting of Mg, Zn, Sc, Hf, Zr, Te, Se, Ta, W, Nb, Cu, Si, Ni, Co, Mo, Cr, Mn, Hg, Pr, and La.

20. The device of claim 18, wherein the thickness of the first electrode layer ranges from 0.1 to 500 nm.

21. The device of claim 14, wherein the transparent conductive oxide is formed of one selected from the group consisting of ITO, ZITO, ZIO, GIO, ZTO, FTO, AZO, GZO, $In_4Sn_3O_{12}$, and $Zn_{1-x}Mg_xO$ ($0 \leq x \leq 1$).

22. The device of claim 21, wherein the thickness of the second electrode layer ranges from 0.1 to 500 nm.

23. The device of claim 14, wherein the optical reflective material is one selected from the group consisting of Ag, an Ag-based alloy, Al, an Al-based alloy, ad Rh.

24. The device of claim 23, wherein the thickness of the third electrode layer ranges from 10 to 5000 nm.

25. The device of claim 14, wherein the fourth electrode layer is formed of one selected from the group consisting of Cu, Cu/Ru, Cu/Ir, a Cu-based alloy, Cu-based alloy/Ru, and Cu-based alloy/Ir.

26. The device of claim 25, wherein the thickness of the fourth electrode layer ranges from 1 to 500 nm.

* * * * *